United States Patent [19]
Nakahashi et al.

[11] Patent Number: 5,319,457
[45] Date of Patent: Jun. 7, 1994

[54] VARIABLE LENGTH IMAGE CODING SYSTEM

[75] Inventors: Tomoko Nakahashi, Kokubunji; Taizo Kinoshita, Musashimurayama, both of Japan

[73] Assignee: Hitachi, Ltd., Tokyo, Japan

[21] Appl. No.: 942,182

[22] Filed: Sep. 9, 1992

[30] Foreign Application Priority Data

Sep. 9, 1991 [JP] Japan ............................ 3-227819

[51] Int. Cl.$^5$ ............................................ H04N 7/13
[52] U.S. Cl. ...................................................... 348/387
[58] Field of Search ......................... 358/133, 141, 142; 375/122; 370/84, 118; H04N 7/13

[56] References Cited

U.S. PATENT DOCUMENTS

| | | | |
|---|---|---|---|
| 4,833,535 | 5/1989 | Ozeki | 358/133 |
| 4,890,283 | 12/1989 | Tsinberg | 370/118 |
| 4,920,426 | 4/1990 | Hatori | 358/433 |
| 4,922,508 | 5/1990 | Moriya | 358/133 |
| 5,022,024 | 6/1991 | Paneth | 375/122 |
| 5,115,309 | 5/1992 | Hang | 358/133 |

*Primary Examiner*—Howard W. Britton
*Attorney, Agent, or Firm*—Antonelli, Terry, Stout & Kraus

[57] ABSTRACT

A variable length image coding system for multiplexing multi channel parallel data at a specified speed after making variable length coding, and capable of suppressing the variation of amount of code generated upon multiplexing to within a specified range. In order that the total output of the sub-buffer memories is suppressed to within a certain range, the bit calculator calculates the amounts of code generated from the coders of each of the variable length coder sets, selects suitable ones of the coders for the respective channels, and controls the selectors, the output time zones of data from the sub-buffer memories, and the multiplexer. The coder buffer memory reads data in synchronism with the transmission speed and controls the variable length coder sets by feedback or stops the output of data by supplying a dummy in order to prevent the overflow and underflow. Since the amount of code for each n blocks is limited, the freedom of the assignment of amount of code to each block can be increased as compared with the case of single-block unit processing.

3 Claims, 5 Drawing Sheets

FIG. 3(a) INPUT DATA AND TIME
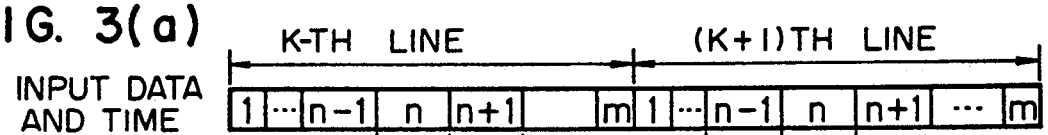
FIG. 3(b) TERM OF OUTPUT
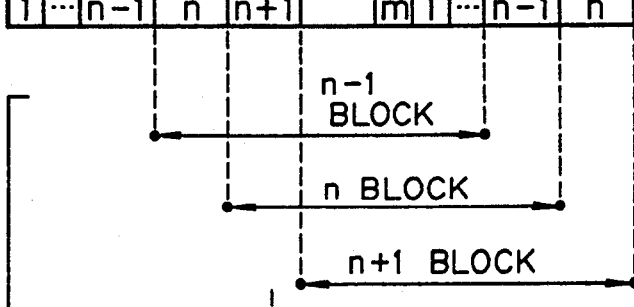
FIG. 3(c) OUTPUT DATA
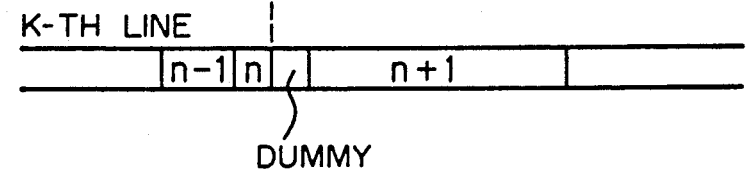
FIG. 3(d)
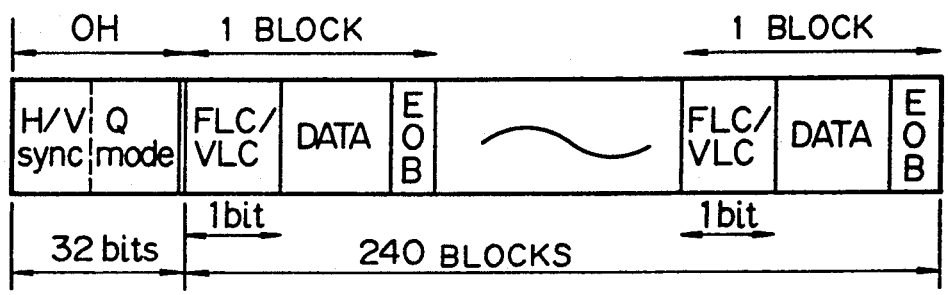

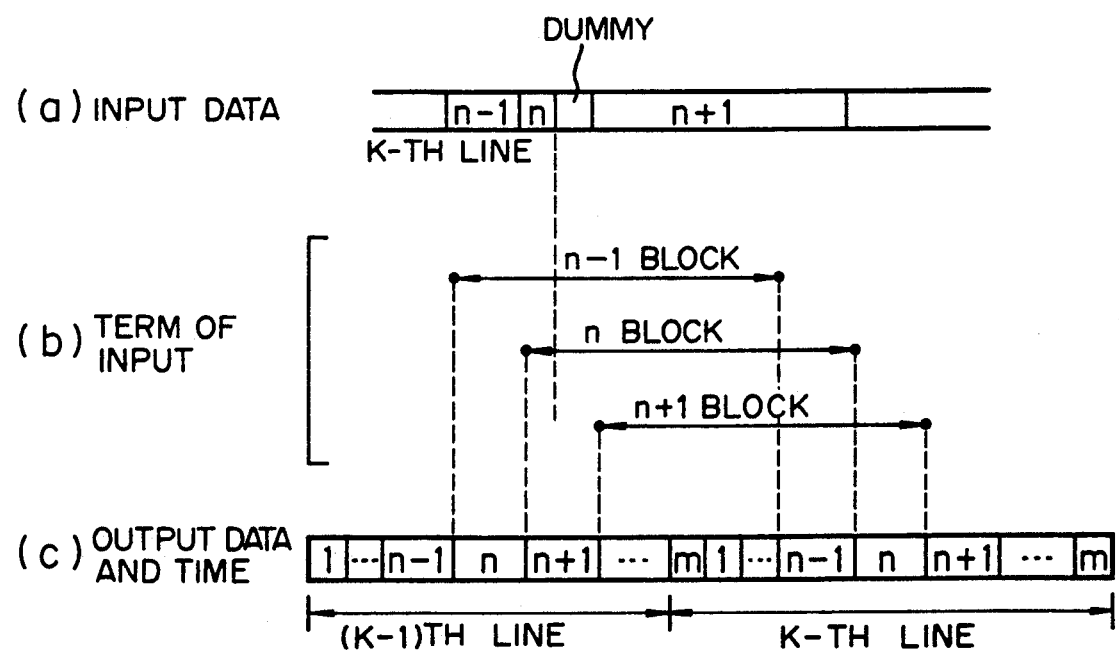

VARIABLE LENGTH IMAGE CODING SYSTEM

BACKGROUND OF THE INVENTION

1. Field of the Invention

This invention relates to systems for coding and transmitting an image signal such as a television signal, and particularly to a system for making variable length coding of an image that is supplied as multi channel parallel data and contains a large amount of information, and then transmitting it in a multiplex manner at a specified speed.

2. Description of the Related Art

An example of the systems for coding and transmitting an image signal such as a television signal is disclosed in U.S. Pat. No. 4,920,426. In this example, single-channel data is subjected to variable length coding by the following process. The data is divided into blocks, an amount of information of each block is calculated, and the amount of codes generated from the data is estimated in advance. Then, a parameter (for example, quantization characteristic) for the control of coding is determined for each block in order that the result of coding matches the transmission speed on the transmission path.

SUMMARY OF THE INVENTION

In order to process an image signal supplied as multi channel parallel data by the system disclosed in the above-given prior art, it is necessary to multiplex the multi channel parallel data, thereby converting it into single-channel serial data, and then estimate the amount of data of each block. If the number of channels of the multi channel parallel data is n (n≧2), the speed of processing the serial data is n times as high as that of a single channel data. Therefore, when the multiplex technique is simply combined with the conventional system, it is difficult to realize the processing circuit for serial data because the operating speed of the circuit elements is limited. More particularly, because the data processing speed is required to be about 70M bits/sec, the circuits for processing at that speed cannot be realized on a commercial basis.

Accordingly, it is an object of the invention to provide a variable length image coding system capable of making variable length coding of an image signal of multi channel parallel data according to a quantization characteristic matched with the transmission speed on a transmission line, and which does not require a severely high operation speed for the circuit elements.

It is another object of the invention to provide an image quantization system for reasonably monitoring in parallel the amounts of code to be assigned to the respective channels of multi channel parallel data, and suppressing the variation of amount of code generated at each n blocks to within a predetermined range.

In order to achieve the above objects, according to this invention, a sub-buffer memory is provided for each channel before the input of a coder buffer memory, so that the variation of amount of code is suppressed to within a predetermined range when variable length coding data are supplied in parallel and multiplexed at a specified speed in a time-sharing manner.

In addition, in order to control the amounts of outputs from the sub-buffer memories for the respective channels, and to produce all channel data within a specified range of time, a plurality of coders are used to code data on each channel, and the optimum inputs to the sub-buffer memories are selected in accordance with the result of computation of the amounts of code.

Moreover, when the total output time of data over all channels is out of a certain range due to an excessive amount of variable length code, the most suitable coder on each channel is selected by the following way. That is, the current coder for the largest-code-amount channel is replaced by the secondarily larger-code-amount coder for that channel. If it is still out of the range, the current coder for the secondarily larger-code-amount channel is replaced by the secondarily larger-code-amount coder, and so on in a repeated manner. When the total output time is too small, the above selection is repeatedly made first for the smallest-code-amount channel, then for the next smaller channel, and so on.

The foregoing and other objects, advantages, manner of operations and novel features of the present invention will be understood from the following detailed description when read in connection with the accompanying drawings.

BRIEF DESCRIPTION OF THE DRAWINGS

FIGS. 3a-3d are explanatory diagrams showing the operation of the transmission side of the embodiment of the invention.

FIG. 5 is an explanatory diagram showing the operation of the receiving side of the embodiment of the invention.

DESCRIPTION OF THE PREFERRED EMBODIMENT

Figure 1:
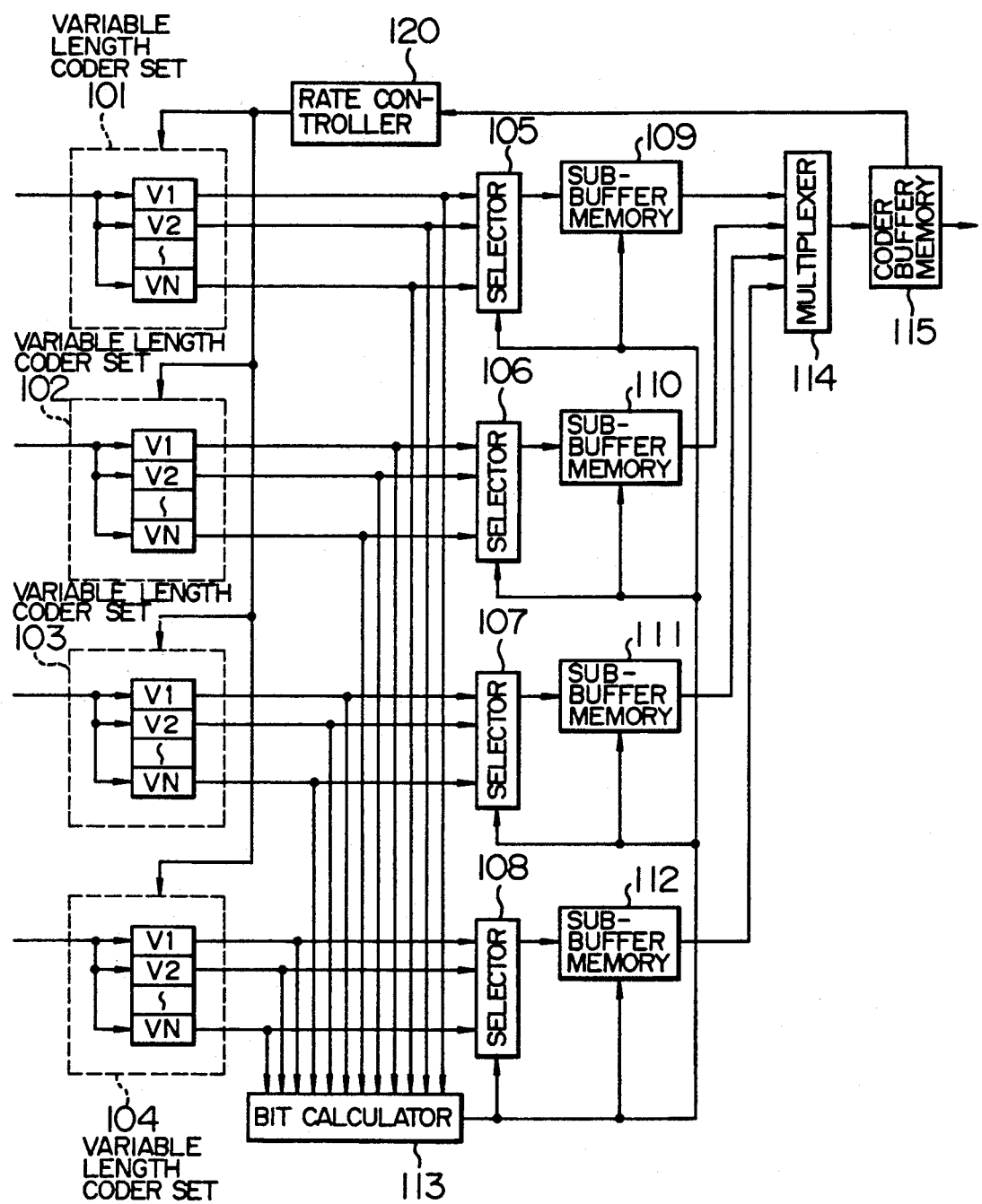
FIG. 1 is a block diagram showing the basic construction of the invention.

FIG. 1 is a block diagram of the basic construction of the transmission side of the invention.

Referring to FIG. 1, there are shown variable length coder sets 101 to 104, selectors 105 to 108, sub-buffer memories 109 to 112, a bit calculator 113, a multiplexer 114, and a coder buffer memory 115.

Each of the variable length coder sets 101 to 104 is formed of N coders V1 to VN which respectively have different quantization characteristics and coding tables. Each of input signals on four parallel channels is coded by the N coders. Four channel parallel data are multiplexed in a time-sharing manner by the multiplexer 114. Thus, the outputs from the sub-buffer memories 109 to 112 are also produced in a time-sharing manner.

The bit calculator 113 calculates the amounts of code from the coders V1-VN on all channels and controls the selectors 105 to 108 to select the optimum coders so that the total output time of all channels falls within a predetermined time. At this time, marks for identifying the selected coders are attached to data at certain positions. The bit calculator 113 also controls the sub-buffer memories 109 to 112 for coded data to produce the outputs within proper time zones and the multiplexer 114 to operate properly. FIG. 3(d) shows the line structure (frame structure) of the time-division multiplexed image data for the respective channels. Each line has at its beginning end the horizontal and vertical synchronizing signals (H/V sync) for the image and the quantization mode signal (Q-Mode). Each of the blocks constituting each line has the identification mark of the coder used (FLC/VLC:Fixed Length Coder/Variable Length Coder) and the EOB (End Of Block) indicating the partition between the blocks. On the receiving side including decoders, by reading each of the identification marks, it is possible to find the coding characteristic by which the data within each block has been decoded.

Since the amounts of code on the four channels are monitored at a time as described above, the serialized data is not necessary to be processed at a high speed. In addition, the production of the outputs from the sub-buffer memories 109 to 112 in a time-sharing manner and the multiplex process of these outputs are performed at a specified speed, thereby determining the upper limit of the amount of input to the coder buffer memory 115. The lower limit thereof is determined by the minimum value of the amounts of code from the coders V1 to VN. The coder buffer memory 115 reads the data in synchronism with the speed of data on the transmission path. In order to prevent the overflow and underflow in this memory, it is necessary that the characteristics of the variable length coder sets 101 to 104 be controlled by feedback or that the data reading be stopped by reading a dummy. At this time, additional information is transmitted for identifying the dummy on the transmission path.

In FIG. 1, there is also shown a rate controller 120. This rate controller monitors the occupied state of the coder buffer memory 115 and makes feedback control for changing the quantization characteristics and coding tables of the variable length coder sets 101 to 104.

According to this image coding system, since the variation of the input to the coder buffer memory 115 is suppressed to within a predetermined range by the feed-forward control, the buffer memory can be occupied almost regularly, and the feedback control can be stabilized. Thus, the image data, when coded and decoded, is almost not deteriorated from the spatial and timing point of view.

Figure 2:
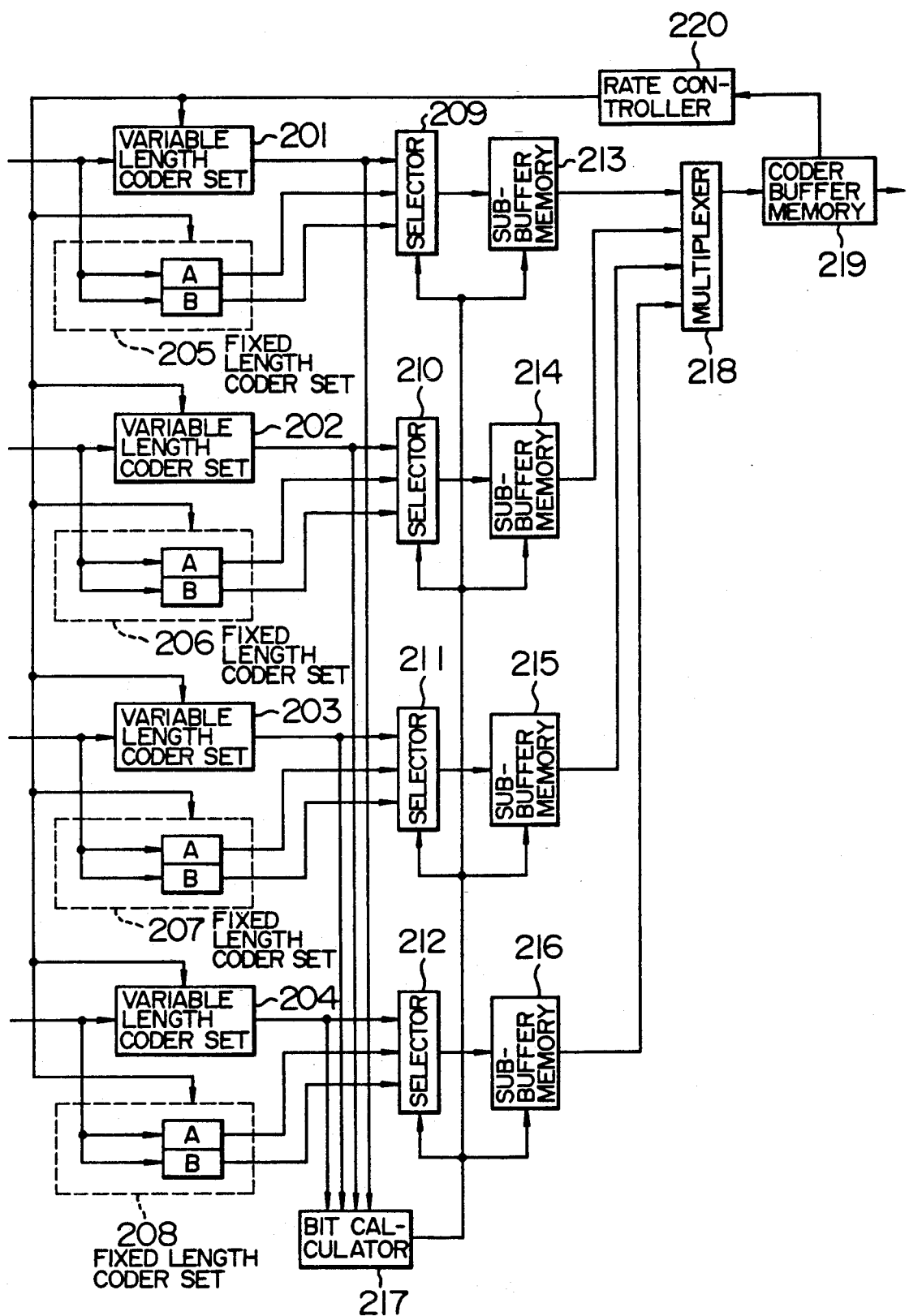
FIG. 2 is a block diagram of the transmission side of one embodiment of the invention.

FIG. 2 is a block diagram of an embodiment of the invention. Referring to FIG. 2, there are shown variable length coder sets 201 to 204, fixed length coder sets 205 to 208, selectors 209 to 212, sub-buffer memories 213 to 216, a bit calculator 217, a multiplexer 218 and a coder buffer memory 219.

The input data on each channel is divided into blocks of which each m blocks is treated as one line, and coded by the variable length coder set 201 to 204 and the fixed length coder set 205 to 208. Each of the fixed length coder sets 205 to 208 is formed of coders A and B of which the coder A makes more code per block than the other.

The selectors 209 to 212 select the inputs to the sub-buffer memories 213 to 216 at each block, and add marks for identifying the coders to the respective blocks. Since each of the sub-buffer memories 213 to 216 stores a unit of line at a time, the capacity of each memory is necessary to be one-line equivalent at the time of the maximum amount of coding. The outputs from the sub-buffer memories are produced at a specified speed within a predetermined range of time in a time-sharing manner, and multiplexed by the multiplexer 218.

The bit calculator 217 calculates the amounts of code from the variable length coder sets 201 to 204 at every blocks. When the total time during which the sub-buffer memories 213 to 216 produce the respective blocks on all channels falls within a specified range of time, the bit calculator selects variable length coder sets 201 to 204 and controls the selectors 209 to 212.

When it is out of the range due to an excessive amount of variable length code, the bit calculator sequentially selects the coders A of the respective channels in the order of large amount of coding until the total time falls within the specified range. When the amount of code is too small, the bit calculator sequentially selects the coders B of the respective channels in the order of small amount of code. Moreover, the bit calculator 217 controls the sub-buffer memories 213 to 216 to produce blocks of respective channels in a time-sharing manner within a time zone, and also the multiplexer 218.

The coder buffer memory 219 produces data at a speed synchronized with the speed of data on the transmission path. When the specified speed of the four-channel multiplexed data is higher than that on the transmission path, the feedback control is made to change the quantization characteristics and coding tables of the coders 201 to 208 depending on the occupied state of the coder buffer memory 219 in order to prevent the overflow and underflow.

On the contrary, when it is slower than the speed of data on the transmission path, the output is stopped and a dummy is transmitted to the transmission path in order to prevent only the underflow. At this time, additional information is transmitted for identifying the dummy on the transmission path.

In FIG. 2, there is also shown a rate controller 220. This rate controller monitors the occupied state of the coder buffer memory 219 and makes the feedback control for changing the quantization characteristics and coding tables of the coders 201 to 208.

According to this embodiment, since the variation of the input to the coder buffer memory 219 is already suppressed within a predetermined range by the feed-forward control, the buffer memory can be almost regularly occupied, and the feedback control can be made stably. Thus, the image data, when coded and decoded, is almost not deteriorated from the spatial and timing point of view.

FIG. 3 shows the input data and time to the sub-buffer memories for the first to fourth channels, the total output time range over the four channels, and the output data after multiplexing.

The input time of each block of one line may be different among the respective channels, but the input time of the same designated blocks of each line must have an equal length among the respective channels. The start point of the output time range of the n-th block of the k-th line corresponds to the end time of the input of the n-th block, and the end point thereof is the remainder of the subtraction of the input time of the n+1-th block from the input start time of the n+1-th block of the k+1 th line.

The amount of fixed length code is established so that when the fixed-length coded block is produced from the sub-buffer memory of each channel, the total output time over all channels is equal to or shorter than the input time.

Thus, even if the output start time on one channel is the end point of the output time range of the previous block, data on all channels can be produced within a range. Therefore, even if data is produced out of the range when the variable length code is selected, any block can be produced within the range by selecting the fixed length code for all channels.

When the n-th block of the k-th line has a small amount of coding so that the next block on a channel is not started to produce within a range, the sub-buffer memory produces a dummy, thereby stopping the data output, and adjustment is made so that the n+1-th block can be produced within the range. The dummy is not written in the coder buffer memory. At this time, when the output stop time is longer than a specified time, the fixed length code is selected for the n-th blocks on the respective channels in the order of small amount of code so that the sub-buffer memories produce constant amounts of code or more.

Since the total time range of the output of blocks over all channels is established, the variation of the amount of the input to the coder buffer memory can be suppressed within a predetermined range.

Figure 4:
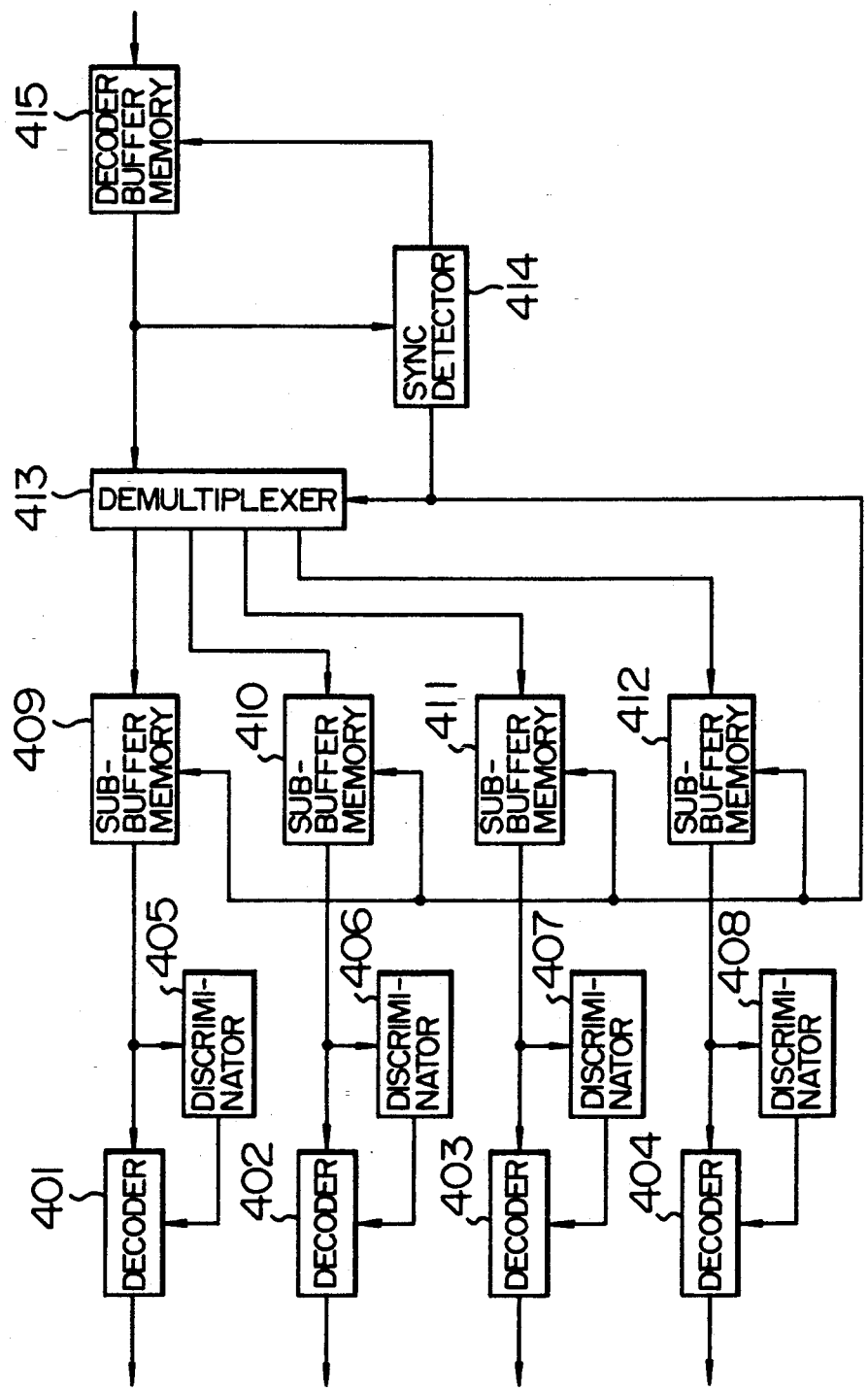
FIG. 4 is a block diagram of the receiving side of the embodiment of the invention.

FIG. 4 shows the construction of the receiving side of this embodiment. In FIG. 4, there are shown decoders 401 to 404, discriminators 405 to 408, sub-buffer memories 409 to 412, a demultiplexer 413, a sync detector 414, and a decoder buffer memory 415.

The decoder buffer memory 415 is supplied with data other than dummy in synchronism with the transmission path, and produces data at the same clock as that to the sub-buffer memories 409 to 412. The demultiplexer 413 separates the multiplexed data into respective data on four channels and supplies them to the sub-buffer memories 409 to 412 for the respective channels in a time-sharing manner. The sync detector 414 detects the line, channel and block of data, and controls so that the total input time of data to the sub-buffer memories 409 to 412 falls within a specified range. Thus, on the respective channels, the output time can be made equal to the input time of each block to the sub-buffer memories 213 to 216 shown in FIG. 2. The discriminators 405 to 408 discriminate coding methods used for each block, and control the decoders 401 to 404 to decode data at each block.

FIG. 5 shows the multiplexed input data to the sub-buffer memories on the receiving side, the input time range of each block on all channels, the output data and output time.

The start point of the input time range of the n-th block of the k-th line corresponds to the end time of the output of the n-th block of the k−1-th line, and the end point thereof is the remainder of the subtraction of the output time of the n+1-th block from the output start time of the n+1-th block of the k-th line. When the input end time of the n-th block on four channels is out of the input time range of the n+1-th block, the sync detector 414 controls the decoder buffer memory 415 to stop. Therefore, the n+1-th block of the input data on the first channel is adjusted to fall within the input time range by inserting a dummy.

As described above, the output time of each block can be made equal to the input time of data to the sub-buffer memories on the transmission side by controlling the input time of data to the sub-buffer memories.

According to this embodiment, since the amounts of code on the four channels are monitored and controlled in parallel, the processing speed can be reduced to ¼ as low as the normal speed, while the coding efficiency in the case of single channel can be maintained. Also, in the case of n channels in parallel, the processing speed can be reduced to 1/n the normal value with the coding efficiency being kept constant.

According to this invention, since the variable length coding control is performed on n channels in parallel, the processing speed can be reduced to 1/n the normal value without changing the coding efficiency. In addition, since a plurality of blocks are monitored at a time by parallel processing and the total amount of code is limited, thus the freedom of the way to assign of code to the respective blocks can be more increased, than the way of the amount of code of individual blocks can be limited.

What is claimed:

1. A coding system for multiplexing multi-channel parallel data into single-channel data after variable-length coding and transmitting said single-channel data through a single coder buffer memory at a speed synchronized with that on a transmission path, comprising:

n coder sets each including a plurality of coders and for coding n-channel parallel data, said coders having different coding characteristics of which the codes are added to said data upon coding;

a bit calculator for computing the amount of code generated from each of said coder sets and controlling so that the total amount of code generated over all channels falls within a predetermined range;

n selectors for selecting the outputs of suitable ones of said coders in accordance with a control signal from said bit calculator;

n sub-buffer memories for temporarily storing the outputs from said selectors;

a multiplexer for multiplexing the outputs from said sub-buffer memories;

a coder buffer memory for temporarily storing the output from said multiplexer in time series; and a rate controller for monitoring said coder buffer memory and controlling said coder sets, said bit calculator controlling said sub-buffer memories to supply their outputs to said multiplexer in time series.

2. A coding system according to claim 1, wherein each of said coder sets is formed of a plurality of variable length coders with different coding characteristics.

3. A coding system according to claim 1, wherein each of said coder sets is formed of a plurality of fixed length coders and variable length coders with different coding characteristics.

* * * * *